(12) United States Patent
Han et al.

(10) Patent No.: US 10,121,923 B2
(45) Date of Patent: Nov. 6, 2018

(54) LAMINATE AND THIN-FILM SOLAR CELL COMPRISING SAME

(71) Applicant: LG CHEM, LTD., Seoul (KR)

(72) Inventors: Hee Han, Daejeon (KR); Kyungjun Kim, Daejeon (KR)

(73) Assignee: LG CHEM, LTD., Seoul (KR)

(*) Notice: Subject to any disclaimer, the term of this patent is extended or adjusted under 35 U.S.C. 154(b) by 0 days.

(21) Appl. No.: 14/441,703

(22) PCT Filed: Jun. 19, 2014

(86) PCT No.: PCT/KR2014/005419
§ 371 (c)(1),
(2) Date: Sep. 22, 2015

(87) PCT Pub. No.: WO2014/204233
PCT Pub. Date: Dec. 24, 2014

(65) Prior Publication Data
US 2016/0071989 A1   Mar. 10, 2016

(30) Foreign Application Priority Data

Jun. 19, 2013 (KR) .................. 10-2013-0070032
Jun. 17, 2014 (KR) .................. 10-2014-0073217

(51) Int. Cl.
*H01L 31/0392* (2006.01)

(52) U.S. Cl.
CPC .. *H01L 31/03926* (2013.01); *H01L 31/03928* (2013.01); *Y02E 10/541* (2013.01)

(58) Field of Classification Search
CPC ............. H01L 31/03926; B05D 3/107; B05D 2201/06
USPC ......... 427/384, 337, 340, 341, 407.1, 419.1; 428/458, 459
See application file for complete search history.

(56) References Cited

U.S. PATENT DOCUMENTS 5,243,024 A    9/1993  Bockrath et al.
5,981,145 A *  11/1999 Ding .................. C08F 8/00
                                              430/271.1
(Continued)

FOREIGN PATENT DOCUMENTS

CN    101918604 A    12/2010
CN    102089365 A    6/2011
(Continued)

OTHER PUBLICATIONS

Search Report issued for CN Application No. 201480002293.5 dated Aug. 25, 2015 (2 pages).
(Continued)

*Primary Examiner* — Devina Pillay
*Assistant Examiner* — Daniel P Malley, Jr.
(74) *Attorney, Agent, or Firm* — Rothwell, Figg, Ernst & Manbeck, P.C.

(57) ABSTRACT

The present invention relates to a laminate including an alkali metal-doped layer. The laminate is processable at high temperatures of at least 550° C. and has excellent durability and barrier properties. Due to these advantages, the laminate can be used to fabricate a thin film solar cell with high flexibility and improved energy conversion efficiency. The present invention also relates to a thin film solar cell including the laminate.

4 Claims, 7 Drawing Sheets

(56) References Cited

U.S. PATENT DOCUMENTS

| | | | |
|---|---|---|---|
| 2003/0144461 A1* | 7/2003 | Fujihara | C08G 73/1007 528/288 |
| 2009/0036643 A1* | 2/2009 | Marks | C07C 17/12 528/380 |
| 2010/0133093 A1 | 6/2010 | MacKie et al. | |
| 2010/0145002 A1* | 6/2010 | Hasegawa | C07C 69/75 528/310 |
| 2010/0269907 A1 | 10/2010 | Lackner et al. | |
| 2011/0067760 A1* | 3/2011 | Shimokawa | C08J 5/18 136/265 |
| 2011/0232761 A1 | 9/2011 | Lomasney | |
| 2011/0272027 A1* | 11/2011 | Lomasney | C23C 26/00 136/262 |
| 2012/0073633 A1 | 3/2012 | Fujdala et al. | |
| 2013/0104972 A1 | 5/2013 | Jeong et al. | |
| 2014/0127497 A1* | 5/2014 | Nakayama | C08G 73/1028 428/335 |

FOREIGN PATENT DOCUMENTS

| | | |
|---|---|---|
| JP | H04-296327 A | 10/1992 |
| JP | 2009-231744 A | 10/2009 |
| JP | 2013-045981 A | 3/2013 |
| JP | 2014-162098 A | 9/2014 |
| JP | 2014-221882 A | 11/2014 |
| KR | 10-2011-0009711 A | 1/2011 |
| WO | 2010/031010 A1 | 3/2010 |

OTHER PUBLICATIONS

Office Action issued for JP Application No. 2015-531030 dated Jan. 8, 2016 (3 pages).

Office Action issued for KR Application No. 10-2014-0073217 dated Sep. 18, 2015 (7 pages).

International Search Report issued in corresponding application No. PCT/KR2014/005419, dated Oct. 13, 2014, 5 pages.

\* cited by examiner

TCO
CIGS
Mo layer
PI Film

LAMINATE AND THIN-FILM SOLAR CELL COMPRISING SAME

BACKGROUND OF THE INVENTION

1. Field of the Invention

The present invention relates to a laminate and a thin film solar cell including the same. More specifically, the present invention relates to a polyimide laminate that is processable at high temperatures of at least 550° C. and can be used to fabricate a thin film solar cell with high flexibility and improved energy conversion efficiency due to its excellent durability and barrier properties, and a thin film solar cell including the laminate.

2. Description of the Related Art

A thin film solar cell using a copper.indium.selenium (CIS)-based or coppe.indium.gallium.selenium (CIGS)-based compound semiconductor as a material for a light-absorbing layer has high photoelectric conversion efficiency. In comparison with other types of solar cells, the thin film solar cell is advantageous in that the light-absorbing layer can be formed into a thin film having a thickness on the order of hundreds of nanometers to a few micrometers, which greatly reduces the amount of the material used. The thin film solar cell has received attention due to the advantage of low fabrication cost.

General thin film solar cells have a structure in which a metal electrode, a light-absorbing layer, and a transparent electrode are sequentially laminated on a substrate. Most conventional thin film solar cells use soda-lime glass substrates. With the recent increasing need for flexible thin film solar cells, flexible films have been used as substrates. In comparison with conventional thin film solar cells using glass substrates, thin film solar cells using flexible films as substrates have a wide range of applications and can be fabricated by roll-to-roll processing, which is suitable for large-scale fabrication, because of their high flexibility and light weight.

In recent years, considerable research efforts have concentrated on the development of polyimides as materials for the formation of flexible films. Polyimides have excellent mechanical properties, heat resistance, chemical resistance, and electrical insulation performance. Due to these advantages, polyimides can be widely used in various films for electronic devices and optical waveguides, such as interlayer insulating films for semiconductors, buffer coats, flexible printed circuit boards, and liquid crystal alignment films.

However, thin film solar cells using polyimide substrates have lower energy conversion efficiency than thin film solar cells using glass substrates and require baking at high temperatures of at least 450° C. to prevent the formation of defects in light-absorbing layers. However, it is difficult to heat the polyimide substrates to 450° C. or above because the bake-out temperature of polyimides is about 450° C. When a polyimide substrate is baked at a high temperature of 500° C. or above to fabricate a thin film solar cell, it suffers from the problem of warpage or poor mechanical properties and the electrodes or the light-absorbing layer is apt to crack.

Numerous methods have been proposed to solve the problems encountered in the fabrication of thin film solar cells using polyimide films as substrate materials. These methods are associated with the attachment of a barrier film to the back side of a polyimide film and the use of a metal as a substrate material. Another method is to use, as a substrate, a polyimide film whose coefficient of linear expansion and tensile strength at break are improved so as to meet the requirements of a flexible substrate, such as high transparency, low thermal expansion, and high glass transition temperature.

However, polyimide films with very high heat resistance sufficient to withstand high temperature baking and good dimensional stability have not yet been developed. The method associated with the formation of a barrier layer at the back side of a polyimide film has the problem that the polyimide film tends to be bent or cut upon high temperature baking. Although the method associated with the use of a metal base layer as a substrate for a thin film solar cell is advantageous in that the metal base layer is processable at high temperatures of 500° C. or above in the fabrication of the solar cell, thus suppressing the formation of defects in the light-absorbing layer, it has the problems that the energy conversion efficiency of the solar cell are deteriorated, it is difficult to carry out a monolithic process, and a process for forming a barrier film is inevitably required due to high surface roughness of the metal base layer and the presence of impurities in the metal.

SUMMARY OF THE INVENTION

An object of the present invention is to provide a laminate that is processable at high temperatures of at least 550° C. and can be used to fabricate a thin film solar cell with high flexibility and improved energy conversion efficiency because of its excellent durability and barrier properties, and a method for producing the laminate.

Another object of the present invention is to provide a thin film solar cell including the laminate that exhibits high flexibility and improved energy conversion efficiency.

A laminate according to one aspect of the present invention has a structure including a polyimide layer and an alkali metal-doped layer disposed on one surface of the polyimide layer.

The laminate may further include a metal base layer wherein the polyimide layer is disposed on one surface of the metal base layer.

The metal base layer may include copper, aluminum, titanium, nickel, or steel use stainless (SUS).

The metal base layer may have a thickness of 100 nm to 100 μm.

The alkali metal may be selected from lithium, sodium, potassium, rubidium, and cesium.

The alkali metal may be doped in an amount of 0.01 to 5% by weight, based on the total weight of the polyimide film layer.

The polyimide may be prepared by polymerizing a tetracarboxylic dianhydride with a diamine to prepare a polyamic acid and imidizing the polyamic acid.

The polyimide film layer may have a thickness of 1 to 60 μm.

The laminate may have a coefficient of thermal expansion of 15 ppm/° C. or less in the temperature range of 100 to 500° C.

The laminate may have a glass transition temperature of at least 550° C.

The laminate may further include a metal electrode layer disposed on the polyimide film layer.

The laminate including the metal electrode layer may have a glass transition temperature of at least 600° C.

According to a further aspect of the present invention, there is provided a method for producing a laminate, including: forming a polyimide layer; and forming a coating layer including an alkali metal source on one surface of the polyimide layer, followed by baking to form an alkali metal-doped layer.

The polyimide layer may be formed on one surface of a metal base layer.

The polyimide layer may be formed by polymerizing a tetracarboxylic dianhydride with a diamine to prepare a polyamic acid, casting a polyimide varnish including the polyamic acid on one surface of the metal base layer, and imidizing the polyamic acid, or subjecting the polyimide varnish to imidization to form a polyimide film and laminating the polyimide film on the metal base layer.

The alkali metal source may be an alkali metal selected from lithium, sodium, potassium, rubidium, and cesium, or a compound including the alkali metal.

The baking may be performed by a soft-baking process at 80 to 150° C. and a hard-baking process at 150 to 500° C.

The coating layer may be formed by coating with an alkali metal doping solution including an alkali metal source and a glycol-based organic solvent.

The alkali metal doping solution may further include at least one solvent selected from the group consisting of propylene glycol monomethyl ether acetate (PGMEA), butyl acetate, ethyl lactate, and butyl lactate.

The method may further include forming a metal electrode layer on the alkali metal-doped layer.

According to another aspect of the present invention, there is provided a thin film solar cell including the laminate.

The thin film solar cell may include a metal base layer, a polyimide layer disposed on one surface of the metal base layer, an alkali metal-doped layer disposed on the polyimide layer, a metal electrode layer disposed on the alkali metal-doped layer, a light-absorbing layer disposed on the metal electrode layer and including a compound semiconductor, and a transparent electrode layer disposed on the light-absorbing layer.

The metal electrode layer may include molybdenum (Mo), aluminum (Al), silver (Ag), gold (Au), platinum (Pt), nickel (Ni), or copper (Cu).

The metal electrode layer may have a thickness of 100 nm to 1 μm.

The compound semiconductor may have a structure in which crystals are oriented preferentially in the (200) direction.

Details of other embodiments according to the invention are included in the following description.

The laminate of the present invention is processable at high temperatures of at least 550° C. and can be used to fabricate a thin film solar cell with high flexibility and improved energy conversion efficiency because of its excellent durability and barrier properties.

In addition, the use of the laminate, which is processable at high temperatures of at least 550° C., eliminates the need for a process of forming a barrier film and enables the fabrication of a thin film solar cell by a monolithic process.

DETAILED DESCRIPTION OF THE INVENTION

As the present invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, detailed explanations of related art are omitted when it is deemed that they may unnecessarily obscure the essence of the present invention.

It will be understood that when an element such as a layer, membrane, film or substrate is referred to as being "above" or "on" another element, it can be directly on the other element or one or more intervening elements may also be present. It will also be understood that when an element such as a layer, membrane, film or substrate is referred to as being "under" another element, it can be directly under the other element or one or more intervening elements may also be present.

The present invention provides a laminate including a polyimide layer doped with an alkali metal.

The present invention also provides a method for producing a laminate, including: forming a polyimide layer; and forming a coating layer including an alkali metal source on one surface of the polyimide layer, followed by baking to form an alkali metal-doped layer.

The present invention also provides a thin film solar cell including the laminate.

Now, a laminate, a method for producing the laminate, and a thin film solar cell including the laminate according to embodiments of the present invention will be described in more detail.

According to one embodiment of the present invention, a laminate is provided which includes a polyimide layer and an alkali metal-doped layer formed on one surface of the polyimide layer.

Various methods have been proposed to increase the energy conversion efficiency of thin film solar cells, for example, by using a soda lime substrate including an alkali metal component as an alkali metal source capable of promoting the crystal growth of a compound semiconductor included in a light-absorbing layer, including an alkali component in a metal electrode of a thin film solar cell using a flexible polymer material or metal material as a substrate material, or forming an additional alkali metal source layer between a metal electrode layer and a light-absorbing layer. In contrast, doping of the polyimide with an alkali metal in the laminate of the present invention eliminates the need to form an additional alkali metal source layer and can facilitate diffusion of the doped alkali metal component into a light-absorbing layer during subsequent high temperature baking for the formation of the light-absorbing layer. As a result, the diffused alkali metal promotes the growth of the crystal grains of a compound semiconductor and the orientation of the crystals in the light-absorbing layer to densify the structure of the light-absorbing layer and decreases the depletion of carriers around the grain boundaries to achieve high voltage and low resistance in the light-absorbing layer, contributing to an improvement in the energy conversion efficiency of a solar cell. In addition, the introduction of the alkali metal into the polyimide film layer by doping provides control over the amount of the alkali metal doped, so that the amount of the alkali metal to be diffused into the light-absorbing layer can be easily controlled.

Specifically, the alkali metal doped into the polyimide may be, for example, lithium, sodium, potassium, rubidium, or cesium. Sodium or potassium is more preferred taking into consideration the crystallinity of a light-absorbing layer and its activation as a dopant.

If the amount of the alkali metal doped into the polyimide is too small, a small amount of the alkali metal is diffused into a light-absorbing layer, resulting in little improvement in energy conversion efficiency. Meanwhile, if the amount of the alkali metal doped is extremely large, the excess alkali metal acts as an impurity, resulting in deterioration of cell performance. It is thus preferable to limit the amount of the alkali metal doped into the polyimide to 0.01 to 5% by weight, based on the total weight of the polyimide film.

The alkali metal-doped polyimide is not particularly limited so long as the polyimide is used as a material for flexible substrates in conventional thin film solar cells. Specifically, the polyimide may be prepared by polymerizing a tetracarboxylic dianhydride with a diamine and imidizing the polymerization product.

The polyimide film layer doped with the alkali metal is preferably from 1 to 60 μm or from 10 to 30 μm in thickness.

The alkali metal-doped layer is preferably from 10 to 500 nm, from 50 to 300 nm, or from 100 to 200 nm in thickness.

According to a further embodiment of the present invention, a polyimide-metal laminate is provided which includes a metal base layer, a polyimide layer disposed on one surface of the metal base layer, and an alkali metal-doped layer formed on the polyimide layer.

In the polyimide-metal laminate, the metal base layer is disposed at the back side of the flexible polyimide film layer and serves as a barrier to the polyimide film layer. Specifically, the metal base layer may be a metal foil substrate. A copper, aluminum, titanium, nickel or SUS foil substrate may be used as the metal foil substrate.

Preferably, the metal base layer has a thickness in the range of 100 nm to 100 μm. Within this range, the metal base layer exerts a barrier effect on the polyimide film layer.

As described above, the polyimide-metal laminate has a multilayer structure including the metal base layer, the polyimide layer, and the alkali metal-doped layer laminated in this order. According to this multilayer structure, the metal base layer is formed at the back side of the polyimide film layer, which is difficult to process at high temperatures of 450° C. or above. The formation of the metal base layer allows the laminate to have a coefficient of thermal expansion of 15 ppm/° C. or less in the temperature range of 100 to 550° C. and a glass transition temperature of at least 550° C., preferably at least 600° C. Thus, the laminate is processable at high temperatures of 550° C. or above for the fabrication of a thin film solar cell. As a result, the application of the laminate to a thin film solar cell can suppress the formation of defects in a transparent electrode layer and a light-absorbing layer of the thin film solar cell. The doping of the alkali metal into the polyimide film layer in the laminate facilitates diffusion of the alkali metal into a light-absorbing layer and control of the amount of the alkali metal diffused to maximize the effect of increasing the energy conversion efficiency of a solar cell.

The present invention also provides a method for producing the laminate.

Specifically, the method may include forming a polyimide layer (step 1) and forming a coating layer including an alkali metal source on one surface of the polyimide layer, followed by baking to form an alkali metal-doped layer (step 2).

Hereinafter, a detailed explanation will be provided based on the individual steps.

In step 1, a polyimide layer is formed on one surface of a base layer, preferably a metal base layer.

The polyimide layer may be directly formed by casting a polyimide varnish including a polyimide precursor and an organic solvent on the metal base layer, followed by imidization. Alternatively, the polyimide layer may be formed by producing a polyimide film and laminating the polyimide film on the metal base layer.

The polyimide varnish may optionally further include an imidization catalyst in addition to the polyimide precursor and the organic solvent.

The polyimide precursor is a polyamic acid that may be prepared by polymerization of a tetracarboxylic dianhydride and a diamine in accordance with any suitable method known in the art, such as solution polymerization. Specifically, the polyamic acid may be prepared by polymerizing a tetracarboxylic dianhydride with a diamine in an organic solvent such as N,N-dimethylacetamide (DMAc), N,N-dimethylformamide or N-methylpyrrolidone (NMP).

Tetracarboxylic dianhydrides suitable for use in the preparation of the polyimide precursor are those that include an aromatic, aliphatic or alicyclic tetravalent organic moiety. Specifically, the tetracarboxylic dianhydride may be selected from the group consisting of butanetetracarboxylic dianhydride, pentanetetracarboxylic dianhydride, hexanetetracarboxylic dianhydride, cyclopentanetetracarboxylic dianhydride, bicyclopentanetetracarboxylic dianhydride, cyclopropanetetracarboxylic dianhydride, methylcyclohexanetetracarboxylic dianhydride, 3,3',4,4'-benzophenonetetracarboxylic dianhydride, 3,4,9,10-perylenetetracarboxylic dianhydride, 4,4'-sulfonyldiphthalic dianhydride, 3,3',4,4'-biphenyltetracarboxylic dianhydride, 1,2,5,6-naphthalenetetracarboxylic dianhydride, 2,3,6,7-naphthalenetetracarboxylic dianhydride, 1,4,5,8-naphthalenetetracarboxylic dianhydride, 2,3,5,6,- pyridinetetracarboxylic dianhydride, m-terphenyl-3,3',4,4'-tetracarboxylic dianhydride, p-terphenyl-3,3',4,4'-tetracarboxylic dianhydride, 4,4'-oxydiphthalic dianhydride, 1,1,1,3,3,3-hexafluoro-2,2-bis[(2,3- or 3,4-dicarboxyphenoxy)phenyl]propane dianhydride, 2,2-bis[4-(2,3- or 3,4-dicarboxyphenoxy)phenyl]propane dianhydride, and 1,1,1,3,3,3-hexafluoro-2,2-bis[4-(2,3- or 4-dicarboxyphenoxy)phenyl]propane dianhydride, and mixtures thereof.

Diamines suitable for use in the preparation of the polyimide precursor are compounds that include an aromatic, aliphatic or alicyclic divalent organic moiety and two amino groups bonded to the organic moiety. Specifically, the diamine may be selected from the group consisting of 2,2'-bis(trifluoromethyl)-4,4'-diaminobiphenyl, m-phenylenediamine, p-phenylenediamine, m-xylylenediamine, p-xylylenediamine, 1,5-diaminonaphthalene, 3,3'-dimethylbenzidine, 4,4'-(or 3,4'-, 3,3'-, 2,4'- or 2,2'-)diaminodiphenylmethane, 4,4'-(or 3,4'-, 3,3'-, 2,4'- or 2,2'-)diaminodiphenyl ether, 4,4'-(or 3,4'-, 3,3'-, 2,4'- or 2,2'-)diaminodiphenyl sulfide, 4,4'-(or 3,4'-, 3,3'-, 2,4'- or 2,2'-) diaminodiphenylsulfone, 1,1,1,3,3,3-hexafluoro-2,2-bis(4-aminophenyl)propane, 2,2-bis(4-(4-aminophenoxy)phenyl)propane, 4,4'-benzophenonediamine, 4,4'-di-(4-aminophenoxy)phenylsulfone, 3,3'-dimethyl-4,4'-diaminodiphenylmethane, 4,4'-di-(3-aminophenoxy)phenylsulfone, 2,4-diaminotoluene, 2,5-diaminotoluene, 2,6-diaminotoluene, benzidine, 4,4'-diaminoterphenyl, 2,5-diaminopyridine, 4,4'-bis(p-aminophenoxy)biphenyl, hexahydro-4,7-methanoindanylene dimethylene diamine, and mixtures thereof. More preferred is the diamine in which one or more hydrogen atoms are substituted with $C_1$-$C_{10}$ fluoroalkyl groups due to its ability to effectively improve the transmittance of a polyimide film.

Examples of preferred tetracarboxylic dianhydrides include biphenyltetracarboxylic dianhydride, 3,3',4,4'-benzophenonetetracarboxylic dianhydride, 3,4,9,10-perylenetetracarboxylic dianhydride, and 4,4'-oxydiphthalic dianhydride. Examples of preferred diamines includes m-phenylenediamine, p-phenylenediamine, m-xylylenediamine, 5-diaminonaphthalene, and 3,3'-dimethylbenzidine.

The tetracarboxylic dianhydride may be polymerized with the diamine in the temperature range of 25 to 50° C. under anhydrous conditions. The molecular weight of the polyimide precursor can be controlled by varying the ratio of the amount of the tetracarboxylic dianhydride to that of the diamine used for the polymerization. The diamine is preferably used in an amount of 0.8 to 1.2 moles or 0.9 to 1.1 moles, based on one mole of the tetracarboxylic dianhydride. Within this range, a polyimide can be prepared that meets the requirements of a flexible substrate for a thin film solar cell in terms of physical properties, such as transmittance, coefficient of thermal expansion, and glass transition temperature.

The organic solvent included in the polyimide varnish may be the same as the solvent used for the preparation of the polyimide precursor by polymerization.

Specifically, the imidization catalyst that is optionally included in the polyimide varnish may be, for example: an imidazole compound, such as 1,2-dimethylimidazole, N-methylimidazole, N-benzyl-2-methylimidazole, 2-methylimidazole, 2-ethyl-4-methylimidazole, N-benzyl-2-methylimidazole or 5-methylbenzimidazole; a quinoline compound, such as isoquinoline; or a pyridine compound, such as 3,5-dimethylpyridine, 3,4-dimethylpyridine, 2,5-dimethylpyridine, 2,4-dimethylpyridine or 4-n-propylpyridine. A catalytic amount of the imidization catalyst may be included in the polyimide varnish.

After the polyimide varnish is cast on the metal base layer, a drying process may be carried out to remove the organic solvent from the polyimide varnish. The drying temperature is preferably 140° C. or below.

After completion of the casting process, the polyimide varnish present in the form of a film on the metal base layer is subjected to imidization to produce a polyimide film.

The imidization may be performed by any suitable method known in the art, such as chemical imidization or thermal imidization. For example, the thermal imidization may be performed by heating the polyimide varnish in the form of a film to a temperature of 80 to 350° C.

According to the alternative method associated with the lamination of a polyimide film on the metal base layer, a tetracarboxylic dianhydride is allowed to react with a diamine in a solvent to prepare a polyimide varnish including a polyamic acid as a polyimide precursor, the polyimide varnish is applied to a release film and subjected to imidization to produce a polyimide film, and the polyimide film is separated from the release film and laminated on the metal base layer.

The tetracarboxylic dianhydride, the diamine, and the solvent used to form the polyimide film layer in the lamination method are the same as those described in the casting method. The release film is not particularly limited so long as it is highly releasable from the polyimide film and can be used for the formation of conventional polyimide films.

The application may be performed by any suitable method known in the art. Specifically, spin coating, bar coating, roll coating, air knife coating, gravure coating, reverse roll coating, kiss roll coating, doctor blade coating, spraying, casting, dipping or brushing may be used to apply the polyimide varnish.

The imidization is the same as that explained in the casting method.

As an alternative to the separation of the polyimide film from the release film and the lamination of the polyimide film on the metal base layer, the metal base layer may be placed on the surface of the polyimide film on which the release film is not formed, and then the polyimide film may be laminated on the metal base layer by a suitable transfer process such as thermal transfer.

In step 2, a coating layer including an alkali metal source is formed on the polyimide film layer formed in step 1, followed by baking to form an alkali metal-doped layer.

Specifically, an alkali metal doping composition including an alkali metal source and a solvent is applied to the polyimide film, followed by baking to form an alkali metal-doped layer.

The alkali metal raw material included in the alkali metal doping composition is a material capable of supplying an alkali metal. Specific examples of such alkali metal raw materials include alkali metals and salts thereof such as alkali metal oxides, chlorides, hydroxides, carbonates, hydrides, and silicates. The alkali metal may be, for example, lithium, sodium, potassium, rubidium, or cesium. Sodium is preferred taking into consideration the crystallinity of a light-absorbing layer and its activation as a dopant. The raw material including sodium as the alkali metal may be a sodium-containing compound selected from the group consisting of sodium (Na), sodium silicate ($Na_2SiO_3$), sodium hydroxide (NaOH), sodium chloride (NaCl), sodium carbonate ($NaCO_3$), sodium borohydride ($NaBH_4$), sodium nitrite ($NaNO_2$), and sodium nitrate ($NaNO_3$), which may be used alone or as a mixture thereof. It should be understood that various other sodium-containing compounds may also be used.

The use of sodium silicate enables the formation of a SiOx film derived from the silicate on the substrate as well as the formation of a layer containing the alkali metal source. In other words, when the alkali metal doping composition containing sodium silicate is used to form an alkali metal source-containing layer on the substrate and a CIS-based solar cell including the alkali metal source-containing layer is fabricated in subsequent processing steps, the diffusion of the alkali metal brings about an improvement in the efficiency of the solar cell and the subsequent processing, i.e., baking, of the silicate in the alkali metal source-containing layer enables the formation of a SiOx film on the substrate.

Generally, the fabrication of a CIS-based solar cell involves patterning by laser irradiation instead of photolithography. The formation of the SiOx film reduces the risk of damage to the substrate upon laser irradiation and damage to other layers (e.g., a Mo-containing back electrode layer or a CIS-containing layer) included in the CIS-based solar cell. Moreover, the formation of the SiOx film brings about further improvement of insulation properties or chemical or physical resistance. Particularly, such improved properties and protective effect on the substrate can be more pronounced in the fabrication of solar cells having flexible substrates.

Any solvent capable of dissolving the alkali metal source may be used without limitation in the alkali metal doping composition. Specific examples of such solvents include alcohols such as ethanol, water ($H_2O$), amines, glycol-based solvents, such as propylene glycol, and other polar solvents.

In one embodiment, the alkali metal doping composition includes a glycol-based organic solvent in addition to the alkali metal source. The use of the organic solvent rather than an aqueous solvent (such as water) makes the doping composition highly wettable to a glass substrate or an organic resin substrate such as a polyimide substrate, enabling uniform coating of the doping composition on the substrate. Accordingly, the alkali metal doping composition can be applied to the substrate by any general method known in the art such as spin coating to uniformly form an alkali metal source-containing layer, and as a result, the alkali metal can be uniformly doped into the substrate and diffused into a CIS-containing layer, enabling the fabrication of a uniform, high-efficiency solar cell.

The glycol-based organic solvent capable of appropriately dissolving the alkali metal source can be used to form a uniform, good alkali metal source-containing layer. In contrast, the other kinds of organic solvents cannot sufficiently dissolve the alkali metal source.

The glycol-based solvent may be selected from the group consisting of ethylene glycol, diethylene glycol, propylene glycol, dipropylene glycol, butylene glycol, 2,3-dibutylene glycol, and glycerol, which may be used alone or as a mixture thereof. Propylene glycol is more preferably used taking into account its ability to readily dissolve the alkali metal source.

In addition to the glycol-based solvent, the alkali metal doping composition may further include at least one solvent selected from the group consisting of propylene glycol monomethyl ether acetate (PGMEA), butyl acetate, ethyl lactate, and butyl lactate. By the use of the additional solvent, the coatability of the alkali metal doping composition can be further improved.

The content of the alkali metal source in the alkali metal doping composition may be determined taking into account the content of the alkali metal to be doped into the polyimide film layer.

The alkali metal doping composition may include about 0.1 to about 10% by weight, about 0.1 to about 5% by weight, or about 0.1 to about 3% by weight of the alkali metal source and about 90 to about 99.9% by weight, about 95 to about 99.9% by weight, or about 97 to about 99.9% by weight of the glycol-based organic solvent in view of proper diffusion of the alkali metal and ease of formation of an alkali metal source-containing layer. In the case where the additional solvent is used together with the glycol-based organic solvent, the alkali metal doping composition may include about 0.1 to about 10% by weight, about 0.1 to about 5% by weight, or about 0.1 to about 3% by weight of the alkali metal source, about 35 to about 65% by weight, about 45 to about 60% by weight, or about 47 to about 55% by weight of the glycol-based organic solvent, and about 30 to about 60% by weight, about 37 to about 54% by weight, or about 40 to about 52% by weight of the additional solvent. However, the contents of the components are not limited to the ranges defined above and may be determined taking into consideration various factors, such as an intended degree of diffusion of the alkali metal depending on the kind of a desired solar cell.

The use of the alkali metal doping composition according to the foregoing embodiment facilitates the formation of a good alkali metal source-containing layer on the substrate by a non-vacuum process suitable for the application of a liquid composition such as spin coating. The alkali metal doping composition may be applied by the same process as described above.

After formation of the alkali metal source-containing layer, a CIS-based solar cell with high efficiency can be easily fabricated by any suitable process known in the art. In addition, the use of the alkali metal doping composition facilitates control over the degree of diffusion of the alkali metal and is preferably applicable to the fabrication of CIS-based solar cells having flexible substrates for which demand is on the rise.

The alkali metal doping composition can be applied to all types of CIS-based solar cells, including CIS solar cells, CGS solar cells, and CIGS solar cells, which are generally known to belong to the category of CIS-based thin film solar cells.

After application of the alkali metal doping composition, baking may be performed at a temperature such that the solvent is removed from the alkali metal doping composition, leaving only the alkali metal component behind.

The baking may be performed by a soft-baking process at about 80 to about 150° C. and a hard-baking process at about 150 to about 500° C. By the baking, the alkali metal can be diffused from the alkali metal source-containing layer into the substrate to form an alkali metal-doped layer.

As a result of the baking, only the alkali metal component remains doped into the polyimide film.

The present invention also provides a thin film solar cell including a laminate produced by the above method.

Figure 1:
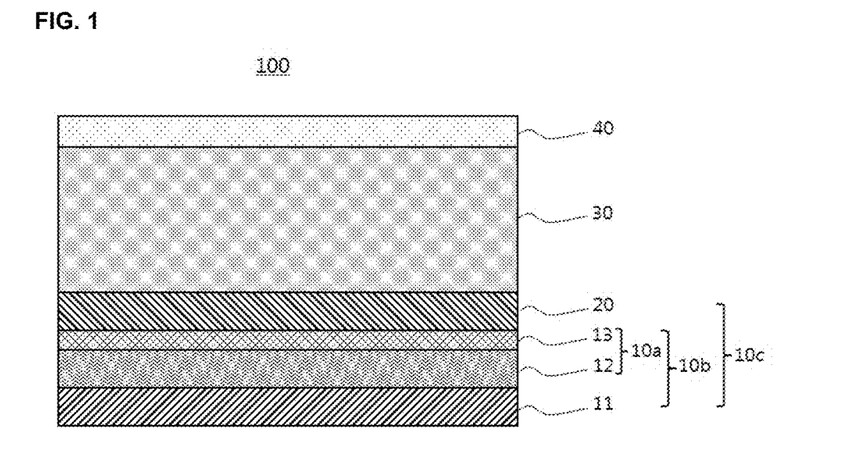
FIG. 1 is a cross-sectional view schematically illustrating the structure of a thin film solar cell according to one embodiment of the present invention.

FIG. 1 is a cross-sectional view schematically illustrating the structure of a thin film solar cell according to one embodiment of the present invention. FIG. 1 is merely illustrative and the present invention is not limited thereto.

With reference to FIG. 1, the thin film solar cell will be explained in more detail. The thin film solar cell 100 has a structure including a laminate 10a having a polyimide film layer 12 and an alkali metal-doped layer 13. The solar cell 100 may also have a structure including a laminate 10b including a metal base layer 11, the polyimide film layer 12 disposed on one surface of the metal base layer 11, and the alkali metal-doped layer 13. The solar cell 100 may also have a laminate 10c further including a metal electrode layer 20.

Specifically, the thin film solar cell 100 includes a metal base layer 11, a polyimide film layer 12 disposed on one surface of the metal base layer 11, an alkali metal-doped layer 13, a metal electrode layer 20 disposed on the alkali metal-doped layer 13, a light-absorbing layer 30 disposed on the metal electrode layer 20 and including a compound semiconductor, and a transparent electrode layer 40 disposed on the light-absorbing layer 30.

The metal electrode layer 20 of the thin film solar cell acts as a metal electrode (or a back electrode). A metal for the metal electrode layer 20 may be any of those commonly used in the art. Specifically, the metal electrode layer 20 may include molybdenum (Mo), aluminum (Al), silver (Ag), gold (Au), platinum (Pt), nickel (Ni), or copper (Cu). Molybdenum is preferred for its high electrical conductivity, ohmic contact with the light-absorbing layer, and good high-temperature stability under a Se atmosphere.

The thickness of the metal electrode layer 20 is preferably in the range of 100 nm to 1 μm. Within this range, improved cell characteristics can be effectively obtained.

The light-absorbing layer 30 includes a compound semiconductor and absorbs sunlight entering through the transparent electrode layer 40 to create electron-hole pairs. Another role of the light-absorbing layer 30 is to transfer the electrons and holes to the different electrodes to generate an electric current.

Specifically, the compound semiconductor may be selected from the group consisting of Group IB (Group 11) element-Group IIIA (Group 13) element-Group VIA (Group 16) element compound semiconductors, Group IIB (Group 12) element-Group VIA (Group 16) element compound semiconductors, and Group IIB (Group 12) element-Group VA (Group 15) element compound semiconductors. The Group IB element may be copper (Cu), the Group IIB element may be cadmium (Cd), the Group IIIA element may be aluminum (Al), gallium (Ga) or indium (In), the Group VIA element may be sulfur (S), selenium (Se) or tellurium (Te), and the Group VA element may be phosphorus (P).

More specifically, the compound semiconductor may be selected from the group consisting of $CuInS_2$, $CuInSe_2$, $CuIn(Se_{1-x}S_x)_2 (0<x<1)$, $Cu(In_{1-y}Ga_y)S_2$ $(0<y<1)$, $Cu(In_{1-y}Ga_y)Se_2 (0<y<1)$, $Cu(In_{1-y}Ga_y)S_2(Se_{1-x}S_x)_2 (0<x<1, 0<y<1)$, $CuGaS_2$, $CuGaSe_2$, $CuGa(Se_{1-x}S_x)_2(0<x<1)$, CdTe, and $Zn_3P_2$. More preferably, the compound semiconductor is selected from the group consisting of $CuInSe_2$, $Cu(In_{1-y}Ga_y)Se_2(0<y<1)$, $CuGaSe_2$, and $Cu(In_{1-y}Ga_y)Se_2(0<y<1)$.

The light-absorbing layer 30 may include a monolayer film structure including a single compound semiconductor selected from the above-mentioned compound semiconductors. Alternatively, the light-absorbing layer 30 may include a multilayer film structure consisting of two or more films including dissimilar compound semiconductors.

The light-absorbing layer 30 may have a thickness of 0.1 to 900 μm. Within this range, optical loss in the light-absorbing layer 30 can be minimized, resulting in an improvement in energy conversion efficiency.

The transparent electrode layer 40 is an electrode through which sunlight enters and is transmitted. Any material that prevents deterioration of transmittance and has low resistivity and surface roughness may be used without particular limitation for the transparent electrode layer 40. Specifically, the transparent electrode layer 40 may be formed using at least one transparent conductive metal oxide selected from the group consisting of indium tin oxide (ITO), fluorine-doped tin oxide (FTO), indium zinc oxide (IZO), ZnO—($Ga_2O_3$ or $Al_2O_3$), tin oxide (TO), antimony tin oxide (ATO), zinc oxide, aluminum-doped zinc oxide, CdO, and $CdSnO_4$. The transparent electrode layer 40 may be a single film of the conductive metal oxide or may consist of two or more films of different conductive metal oxides.

The transparent electrode layer 40 may further include a transparent substrate (not illustrated) on the surface of the transparent electrode layer opposite to the surface thereof in contact with the light-absorbing layer 30. The transparent substrate acts as a support for the transparent electrode layer 40 and may be made of any transparent material through which external light can pass. Specific examples of such transparent materials include: plastics such as polyethylene terephthalate, polyethylene naphthalate, polycarbonate, polypropylene, polyimide, triacetyl cellulose, and copolymers thereof; and glass. The transparent substrate may be doped with a material selected from the group consisting of titanium (Ti), indium (In), gallium (Ga), and aluminum (Al).

A buffer layer (not illustrated) may be positioned between the transparent electrode layer 40 and the light-absorbing layer 30 to moderate differences in work function and lattice constant between the light-absorbing layer and the transparent electrode layer, facilitating the migration of holes and electrons. An n-type semiconductor, specifically, at least one compound selected from the group consisting of CdS, ZnS, ZnSe, and $In_2O_3$ may be used to form the buffer layer.

The present invention also provides a method for fabricating the thin film solar cell.

Specifically, the method of the present invention includes producing a substrate, and forming a metal electrode layer, a light-absorbing layer, and a transparent electrode layer in this order on the substrate.

The substrate may be produced in accordance with the method for producing the polyimide-metal laminate described above.

The metal electrode layer may be formed by any suitable method known in the art, such as sputtering, vacuum deposition or slurry coating. In the case where the metal electrode layer is formed by sputtering, molybdenum as a material for the metal electrode layer may be deposited in a plasma gas using a sputtering system. The plasma gas may be, for example, argon (Ar), neon (Ne) or xenon (Xe) gas. It is preferable to maintain the internal temperature and pressure of the sputtering system at 25 to 120° C. and 3 to 10 mtorr, respectively. A DC power is 150 to 200 W is preferred.

The light-absorbing layer may be formed using the above-mentioned compound semiconductor by any suitable process known in the art, for example, physical vapor deposition, such as sputtering or vacuum deposition, or chemical vapor deposition. Alternatively, the light-absorbing layer may be formed using a composition including the compound semiconductor by a non-vacuum coating process known in the art such as spraying, printing or electrodeposition. When it is intended to form a CIG-based light-absorbing layer by sputtering, an alloy such as CuIn or CuGa or a group of metals such as Cu, In or Ga as a target may be allowed to grow at room temperature. At this time, the composition and crystal growth direction of the compound semiconductor for the formation of the light-absorbing layer may be controlled by appropriately varying the growth pressure and temperature. The growth pressure and temperature are preferably adjusted to 3 to 10 mtorr and 25 to 600° C., respectively. Within these ranges, the crystals grow preferentially in the (200) direction. The DC power is preferably from 120 to 200 W. In the case where selenization of the compound semiconductor layer is further needed, baking is performed by heating at a rate of 10 to 50° C./sec to a temperature of 450 to 600° C. under a nitrogen, oxygen or argon gas atmosphere.

In the light-absorbing layer formed under the above conditions, the crystal growth of the compound semiconductor is promoted and the grown crystals are oriented preferentially in the (200) direction by the action of the alkali metal component diffused from the polyimide film layer and the diffusion of gallium.

Next, the transparent electrode layer may be formed on the light-absorbing layer by any suitable process known in the art, and thus detailed explanation thereof is omitted herein.

As described above, the method of the present invention uses, as the substrate, a laminate including a metal substrate and a polyimide film layer disposed on one surface of the metal substrate and doped with an alkali metal. The laminate is processable at high temperatures of at least 550° C. The use of the laminate eliminates the need for a process of the forming a barrier film and enables the fabrication of a thin film solar cell by a monolithic process.

Hereinafter, embodiments of the present invention will be explained in detail such that the invention can be easily carried out by a person having ordinary knowledge in the art. The invention may, however, be embodied in many different forms and should not be construed as being limited to the embodiments set forth herein.

PREPARATIVE EXAMPLES 1-2

Preparation of Alkali Metal Doping Solutions

According to the compositions shown in Table 1, the alkali metal source was dissolved in the glycol-based solvent using a stirrer at room temperature until the solution had a concentration of 0.1-5 wt %. The solution was diluted with the additional solvent to 10-80 wt % and filtered to prepare alkali metal doping solutions.

TABLE 1

|  | Alkali metal source | Content (wt %) | Glycol-based solvent | Content (wt %) | Additional solvent | Content (wt %) |
|---|---|---|---|---|---|---|
| Preparative Example 1 | $Na_2SiO_3$ | 0.125 | Propylene glycol | 49.875 | PGMEA | 50 |
| Preparative Example 2 | NaOH | 0.175 | Propylene glycol | 49.825 | PGMEA | 50 |

EXAMPLE 1

Production of Polyimide-metal Laminate

Para-diamine (PDA, 0.148 mol) was dissolved in 16 g of anhydrous DMAc, and then 3,3',4,4'-biphenyltetracarboxylic dianhydride (BPDA, 0.146 mol) was added thereto. The mixture was stirred at 45° C. for 2 h and at 40° C. for 24 h. The reaction was allowed to proceed under anhydrous conditions.

As a result of the reaction, a polyimide varnish was prepared. The solid content (wt %) of the polyimide varnish was controlled such that the viscosity became 10,000 cP.

The polyimide varnish was cast to a thickness of 20 μm on a 10 μm thick copper substrate as a metal base layer, followed by drying to form a film. The resulting structure was put into an oven, heated at a rate of 2° C./min, and maintained at 80° C. for 15 min, at 150° C. at 30 min, at 220° C. for 30 min, and at 350° C. for 1 h to imidize the polyimide varnish.

After completion of the imidization, the composition of Preparative Example 1 was spin coated on the polyimide film, soft baked on a hot plate at 90° C. for 1 min, and hard baked in an oven at 450° C. to produce a laminate in which the polyimide layer and a sodium-doped layer were sequentially formed on the metal base layer. The polyimide layer and the sodium-doped layer were found to have thicknesses of about 12.5 μm and about 150 nm, respectively.

EXAMPLE 2

Fabrication of Thin Film Solar Cell

Step 1: Formation of Electrode Layer

A molybdenum (Mo) target (size: 2 inch, thickness: 0.25 mm, purity: 99.99%) was sputtered on the sodium-doped layer of the laminate produced in Example 1 for 5 min while rotating the laminate at 15 rpm. As a result of the sputtering, a 1 μm thick Mo metal electrode layer was formed. For the sputtering, Ar with 99.999% purity was used as a plasma gas and the internal pressure of the reactor was maintained at $10^{-6}$ torr. The growth temperature and pressure were adjusted to 25° C. and 4-10 mtorr, respectively, and DC power was set to 2000-4000 W.

The laminate thus produced had a structure in which the molybdenum metal electrode layer was formed on the laminate of Example 1.

Step 2: Fabrication of Thin Film Solar Cell

Gallium, copper, indium, and selenium were deposited on the laminate produced in Step 1 by co-evaporation at 500° C. to form a light-absorbing layer. At that time, the growth pressure and DC power were set to 5 mtorr and 120 W, respectively.

Subsequently, a transparent electrode layer composed of aluminum-doped zinc oxide and having a size of 10 cm×10 cm was laminated in contact with the light-absorbing layer of the laminate, completing the fabrication of a thin film solar cell.

EXAMPLE 3

A thin film solar cell was fabricated in the same manner as in Examples 1 and 2, except that the alkali metal doping composition of Preparative Example 2 was used.

COMPARATIVE EXAMPLE 1

Production of Polyimide Film

Para-diamine (PDA, 0.148 mol) was dissolved in 16 g of anhydrous DMAc, and then 3,3',4,4'-biphenyltetracarboxylic dianhydride (BPDA, 0.146 mol) was added thereto. The mixture was stirred at 45° C. for 2 h and at 40° C. for 24 h. The reaction was allowed to proceed under anhydrous conditions.

As a result of the reaction, a polyimide varnish was prepared. The solid content (wt %) of the polyimide varnish was controlled such that the viscosity became 10,000 cP.

The polyimide varnish was cast to a thickness of 20 μm on a release film made of metal, followed by drying to form a film. The resulting structure was put into an oven, heated at a rate of 2° C./min, and maintained at 80° C. for 15 min, at 150° C. at 30 min, at 220° C. for 30 min, and at 350° C. for 1 h to imidize the polyimide varnish.

After completion of the imidization, the release film on which the polyimide film had been formed was cooled, and the polyimide film was separated from the release film.

COMPARATIVE EXAMPLE 2

Production of Polyimide Film-molybdenum Metal Electrode Layer Laminate

Under the same conditions and by the same procedure as described in Step 1 of Example 2, a 400-800 nm thick Mo layer was formed on the polyimide film produced in Comparative Example 1 using a DC sputtering system to produce a polyimide film-molybdenum metal electrode layer laminate.

COMPARATIVE EXAMPLE 3

Fabrication of Thin Film Solar Cell

A thin film solar cell was fabricated in the same manner as in Step 2 of Example 2, except that the polyimide film-molybdenum metal electrode layer laminate of Comparative Example 2 was used instead of the laminate produced in Step 1 of Example 2. The thin film solar cell had a structure in which a light-absorbing layer and a transparent electrode layer were sequentially formed on the molybdenum metal electrode layer.

TEST EXAMPLE 1

Thermal mechanical analysis (TMA) was conducted on the laminate produced in Example 1 and the polyimide film produced in Comparative Example 1.

Figure 2:
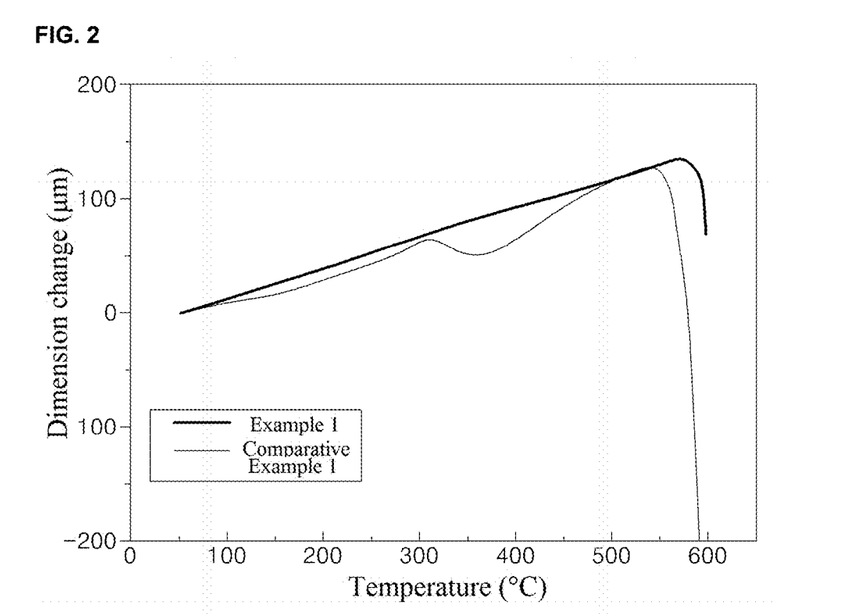
FIG. 2 is a graph showing the results of thermomechanical analysis (TMA) for a laminate produced in Example 1 and a polyimide film produced in Comparative Example 1.

The results are shown in FIG. 2.

As shown in FIG. 2, the laminate of Example 1 had a higher glass transition temperature (585° C.) than the polyimide film of Comparative Example 1 (546° C.), demonstrating improved thermal stability of the laminate of Example 1.

TEST EXAMPLE 2

Thermal mechanical analysis (TMA) was conducted on the laminate produced in Step 1 of Example 2, the polyimide film of Comparative Example 1, and the polyimide film-molybdenum metal electrode layer laminate of Comparative Example 2.

Figure 3:
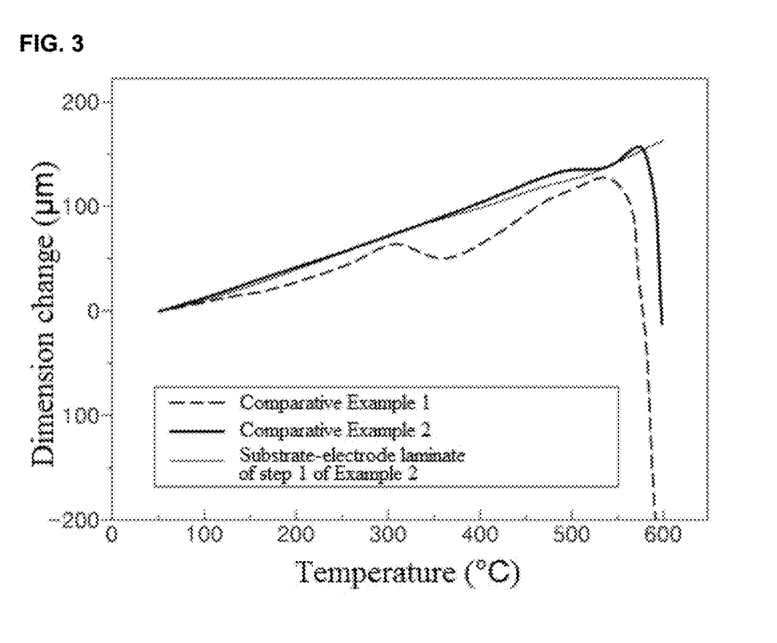
FIG. 3 is a graph showing the results of thermomechanical analysis (TMA) for a laminate produced in Step 1 of Example 2, a polyimide film produced in Comparative Example 1, and a polyimide film-molybdenum metal electrode layer laminate produced in Comparative Example 2.

The results are shown in FIG. 3.

As shown in FIG. 3, the laminate produced in Step 1 of Example 2 had a much higher glass transition temperature (>600° C.) than the polyimide film of Comparative Example 1 (546° C.) and the polyimide film-molybdenum metal electrode layer laminate of Comparative Example 2 (575° C.), demonstrating improved thermal stability of the laminate of Example 1.

TEST EXAMPLE 3

The thin film solar cell fabricated in Example 2 was bent by hand to evaluate its flexibility. The results are shown in FIG. 4.

Figure 4:
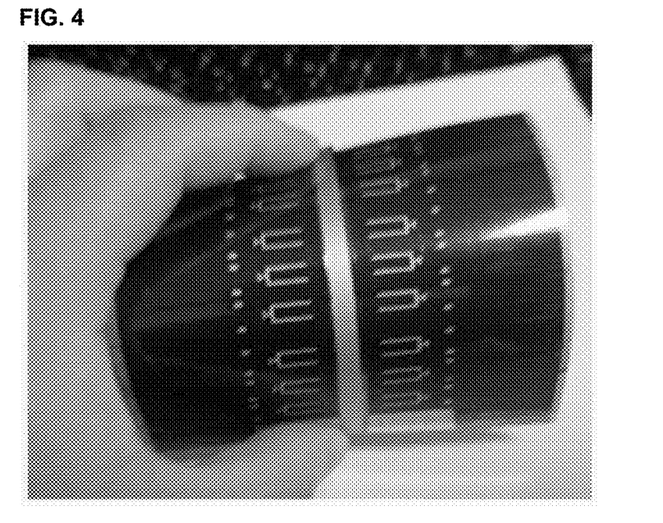
FIG. 4 is a photograph of a thin film solar cell fabricated in Example 2.

As shown in FIG. 4, the thin film solar cell was flexible.

TEST EXAMPLE 4

Figure 5A:
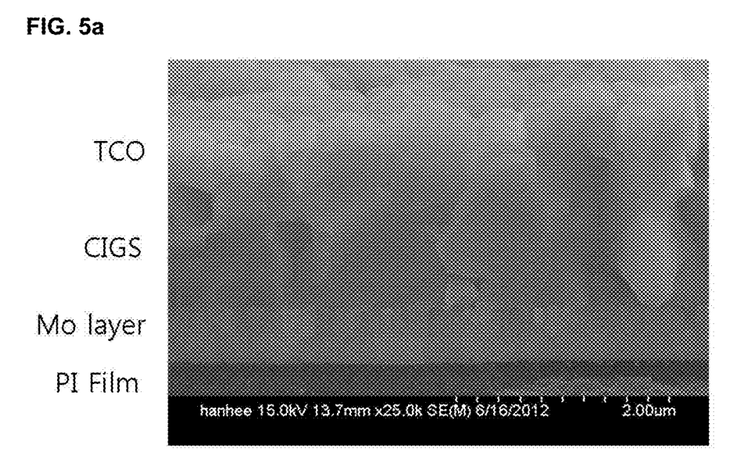
FIG. 5a is a field emission scanning electron microscopy (FE-SEM) image showing the cross-section of a thin film solar cell fabricated in Example 2.
Figure 5B:
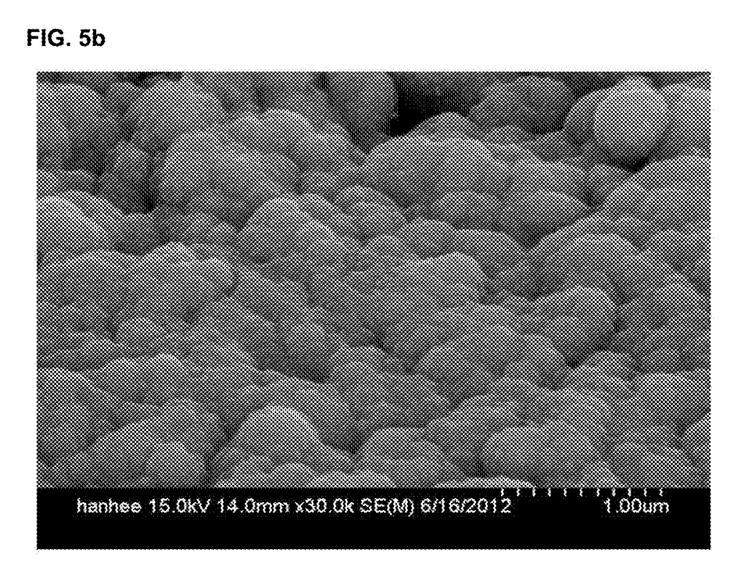
FIG. 5b is an FE-SEM image showing the surface of the uppermost layer of the thin film solar cell.

The cross-section and the surface of the uppermost layer of the thin film solar cell fabricated in Example 2 were observed using a field emission scanning electron microscope (FE-SEM), and the results are shown in FIGS. 5a and 5b, respectively.

Figure 6A:
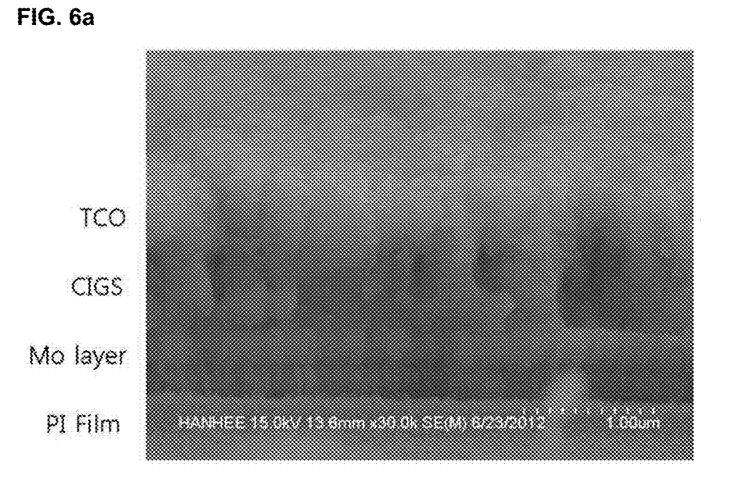
FIG. 6a is an FE-SEM image showing the cross-section of a thin film solar cell fabricated in Comparative Example 3.
Figure 6B:
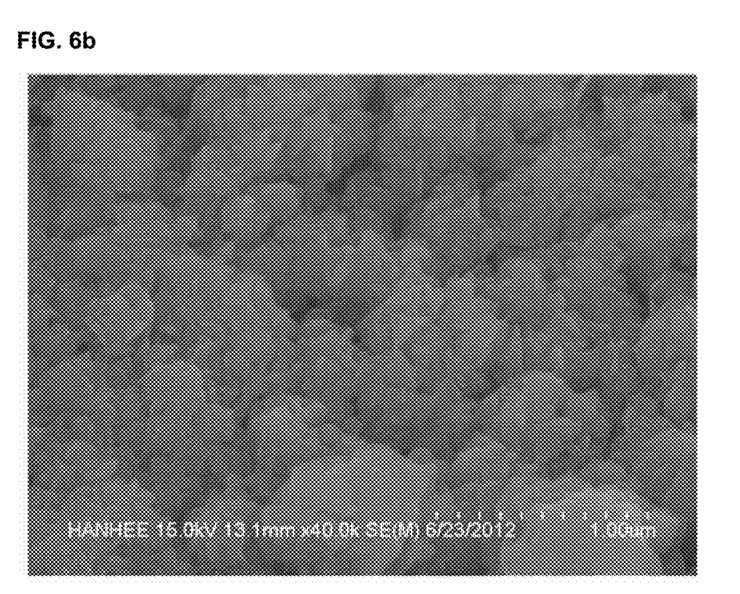
FIG. 6b is an FE-SEM image showing the surface of the uppermost layer of the thin film solar cell.

The cross-section and the surface of the uppermost layer of the thin film solar cell fabricated in Comparative Example 3 were observed using an FE-SEM, and the results are shown in FIGS. 6a and 6b, respectively. In each of FIGS. 5a and 6a, PI Film denotes the polyimide film layer, Mo layer denotes the molybdenum metal electrode layer, CIGS denotes the light-absorbing layer including the CIGS compound semiconductor, and TCO denotes the transparent electrode layer. The copper substrate formed at the back side of the polyimide film layer (PI Film) was excluded from each of the cross-sectional images of the thin film solar cells.

As shown in FIGS. 5a, 5b, 6a, and 6b, the light-absorbing layer of the thin film solar cell of Example 2 had a larger crystal grain size of the compound semiconductor and a denser structure than the light-absorbing layer of the thin film solar cell of Comparative Example 3.

TEST EXAMPLE 5

Figure 7:
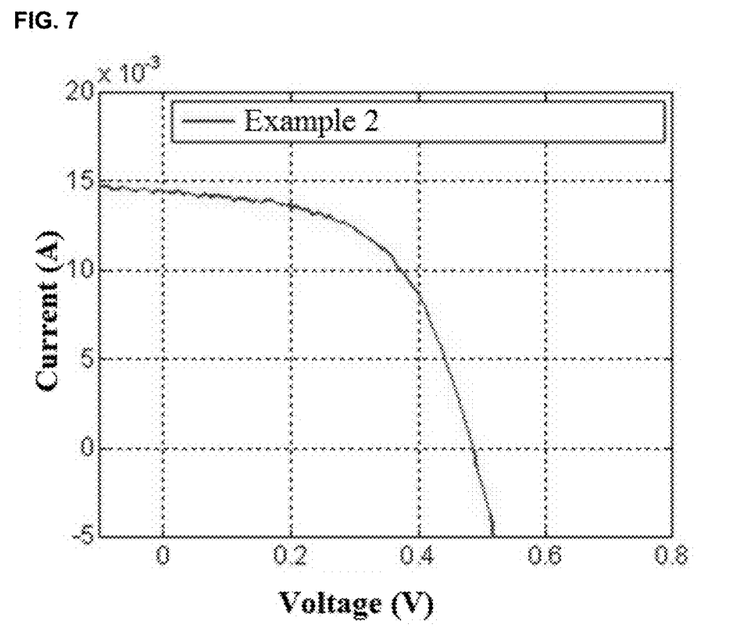
FIG. 7 is a curve showing the current-voltage characteristics of a thin film solar cell fabricated in Example 2.
Figure 8:
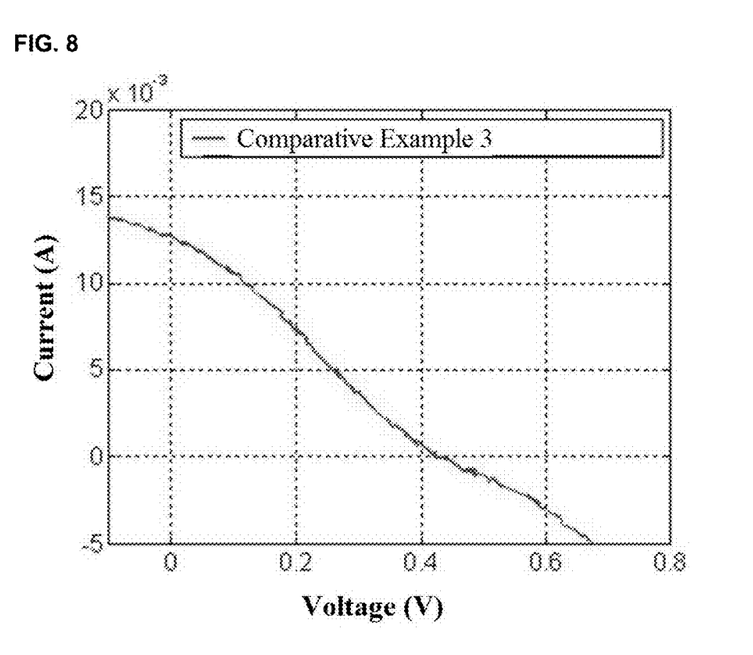
FIG. 8 is a curve showing the current-voltage characteristics of a thin film solar cell fabricated in Comparative Example 3.

The current-voltage characteristics of the thin film solar cells fabricated in Example 2 and Comparative Example 3 were measured using a solar simulator, and the results are shown in FIGS. 7 and 8, respectively. The open circuit voltages (Voc), fill factors (FF), energy conversion efficiencies (Eff), and short circuit currents ($J_{sc}$) of the thin film solar cells were calculated from the current-voltage curves. The results are shown in Table 2. The solar simulator was equipped with a xenon lamp whose power and light intensity were set to 100 W and 100 W/cm$^2$, respectively. The solar conditions (AM 1.5) of the xenon lamp were calibrated using a standard solar cell.

FIG. 7 is a curve showing the current-voltage characteristics of the thin film solar cell fabricated in Example 2, and FIG. 8 is a curve showing the current-voltage characteristics of the thin film solar cell fabricated in Comparative Example 3.

TABLE 2

| | Voc (V) | FF (%) | Eff (%) | $J_{sc}$ (mA/cm$^2$) |
|---|---|---|---|---|
| Example 2 | 0.49 | 55.21 | 7.0 | 25.79 |
| Comparative Example 3 | 0.43 | 26.03 | 2.7 | 22.74 |

As shown in FIGS. 7 and 8 and Table 2, the performance characteristics (6.94%, 0.003886 W) of the thin film solar cell of Example 2 including the sodium-doped polyimide film layer were considerably improved compared to those (2.564%, 0.001436 W) of the thin film solar cell of Comparative Example 3 including the undoped polyimide film layer.

TEST EXAMPLE 6

Figure 9:
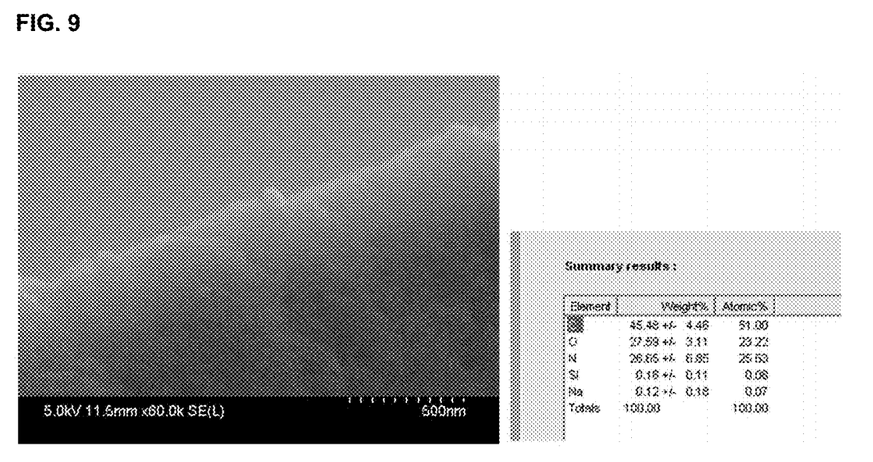
FIG. 9 is an image showing the results of SEM/EDX for a portion of an alkali metal-doped layer formed by application and hard-baking of an alkali metal doping solution in Example 1.

A portion of the sodium-doped layer formed in the course of the production of the laminate in Example 1 was analyzed by SEM/EDX, and the results are shown in FIG. 9. From the results, it was confirmed that when the sodium-doped layer was formed using the alkali metal doping solution including sodium silicate as an alkali metal source, a SiOx thin film was derived from the alkali metal source.

TEST EXAMPLE 7

The Mo/polyimide layers (Na-doped one in Example 2 and Na-undoped one in Comparative Example 2) formed during fabrication of the solar cells in Examples 2 and 3 and Comparative Example 2 were patterned by a 1064 nm laser. The patterned Mo/polyimide layers were observed and analyzed by optical microscopy (OP), and the results are shown in FIGS. 10 to 12.

Figure 10:
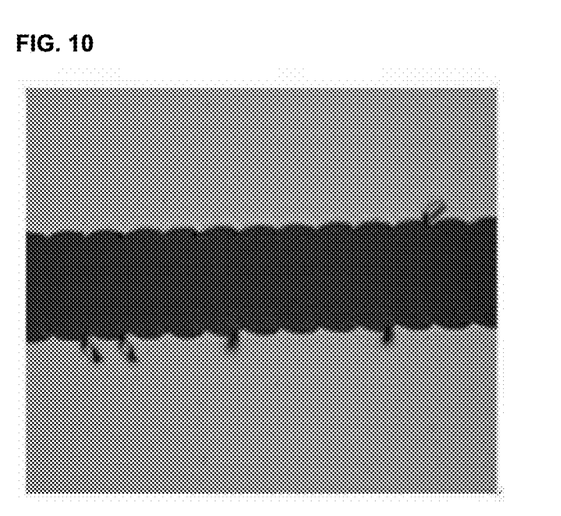
FIGS. 10 to 12 are optical microscopy (OM) images of molybdenum (Mo)/polyimide layers formed by Mo layer deposition in Examples 2 and 3 and Comparative Example 2 after laser irradiation, respectively.
Figure 11:
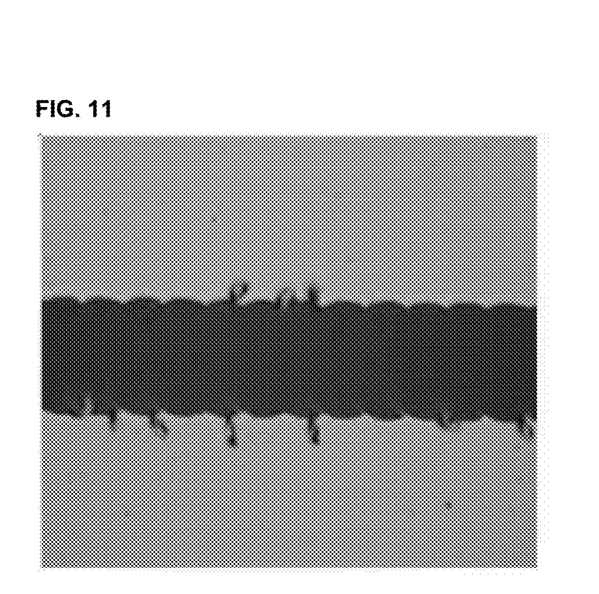
Figure 12:
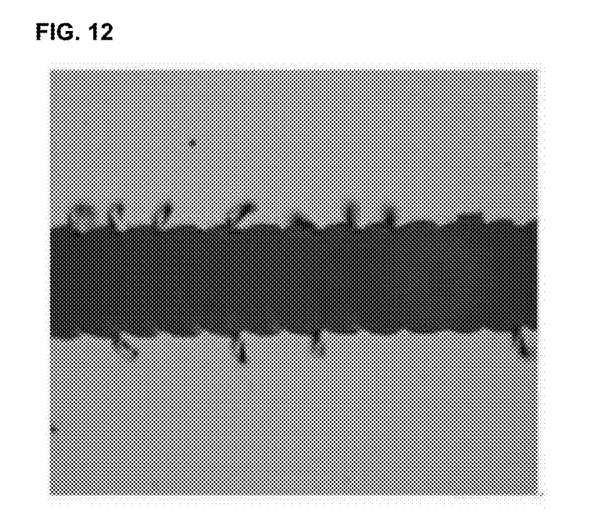

FIGS. 10 to 12 confirm that even after the 1064 nm laser patterning, there was little or no damage to the Mo/polyimide layer by the Na-doped layer formed in Example 2. In addition, less damage to the Mo/polyimide layer formed in Example 3 was observed. In contrast, the laser patterning caused considerable damage to the Mo/polyimide layer formed in Comparative Example 2.

While specific embodiments of the invention have been described in detail, it will be appreciated by those skilled in the art that such detailed descriptions are merely preferred embodiments and the scope of the present invention is not limited thereto. Therefore, the true scope of the present invention should be defined by the appended claims and their equivalents.

EXPLANATION OF REFERENCE NUMERALS 10a, 10b, 10c Laminates
11 Metal base layer
12 Polyimide film layer
20 Metal electrode layer
30 Light-absorbing layer
40 Transparent electrode layer
100 Thin film solar cell

INDUSTRIAL APPLICABILITY

The laminate of the present invention is processable at high temperatures of at least 550° C. and can be used to fabricate a thin film solar cell with high flexibility and improved energy conversion efficiency because of its excellent durability and barrier properties.

In addition, the use of the laminate, which is processable at high temperatures of at least 550° C., eliminates the need for a process of forming a barrier film and enables the fabrication of a thin film solar cell by a monolithic process.

What is claimed is:

1. A method for producing a laminate, comprising sequentially:
    forming a polyimide layer on one surface of a metal base layer by polymerizing a tetracarboxylic dianhydride with a diamine to prepare a polyamic acid, casting a polyimide varnish comprising the polyamic acid on one surface of the metal base layer, and imidizing the polyamic acid; or subjecting the polyimide varnish to imidization to form a polyimide film and laminating the polyimide film on the metal base layer; and then
    forming a coating layer comprising an alkali metal source on one surface of the imidized polyimide layer, followed by forming an alkali metal-doped layer by a soft-baking process at 80 to 150° C. and a hard-baking process at 150 to 500° C. so that only the alkali metal is doped on one surface of the polyimide layer,
    wherein the coating layer is formed by coating with an alkali metal doping solution consisting essentially of an alkali metal source and a glycol-based organic solvent,
    wherein the glycol-based organic solvent is selected from at least one of ethylene glycol, diethylene glycol, propyleneglycol, dipropylene glycol, butylene glycol, 2,3-dibutyleneglycol and glycerol.

2. The method according to claim 1, wherein the alkali metal source is an alkali metal selected from lithium, sodium, potassium, rubidium, and cesium, or a compound comprising the alkali metal.

3. The method according to claim 1, further comprising forming a metal electrode layer on the alkali metal-doped layer.

4. A method for producing a laminate, comprising sequentially:
    forming a polyimide layer on one surface of a metal base layer by polymerizing a tetracarboxylic dianhydride with a diamine to prepare a polyamic acid, casting a polyimide varnish comprising the polyamic acid on one surface of the metal base layer, and imidizing the polyamic acid; or subjecting the polyimide varnish to innidization to forma polyimide film and laminating the polyimide film on the metal base layer; and then
    forming a coating layer comprising an alkali metal source on one surface of the imidized polyimide layer, followed by forming an alkali metal-doped layer by a soft-baking process at 80 to 150° C. and a hard-baking process at 150 to 500° C. so that only the alkali metal is doped on one surface of the polyimide layer,
    wherein the coating layer is formed by coating with an alkali metal doping solution consisting essentially of an alkali metal source, a glycol-based organic solvent, and another solvent,
    wherein the glycol-based organic solvent is selected from at least one of ethylene glycol, diethylene glycol, propyleneglycol, dipropylene glycol, butylene glycol, 2,3-dibutyleneglycol and glycerol,
    wherein the another solvent is selected from the group consisting of propylene glycol monomethyl ether acetate (PGMEA), butyl acetate, ethyl lactate, and butyl lactate.

* * * * *